(12) United States Patent
Zhang et al.

(10) Patent No.: US 8,476,765 B2
(45) Date of Patent: Jul. 2, 2013

(54) COPPER INTERCONNECT STRUCTURE HAVING A GRAPHENE CAP

(75) Inventors: John Hongguang Zhang, Fishkill, NY (US); Cindy Goldberg, Cold Spring, NY (US); Walter Kleemeier, Fishkill, NY (US); Ronald Kevin Sampson, Lagrangeville, NY (US)

(73) Assignee: STMicroelectronics, Inc., Coppell, TX (US)

( * ) Notice: Subject to any disclaimer, the term of this patent is extended or adjusted under 35 U.S.C. 154(b) by 291 days.

(21) Appl. No.: 12/961,251

(22) Filed: Dec. 6, 2010

(65) Prior Publication Data

US 2012/0139114 A1 Jun. 7, 2012

(51) Int. Cl.
*H01L 29/40* (2006.01)
*H01L 21/4763* (2006.01)

(52) U.S. Cl.
USPC ............ 257/758; 257/760; 438/622; 438/629

(58) Field of Classification Search
USPC .................................. 257/758, 760; 438/629
See application file for complete search history.

(56) References Cited

U.S. PATENT DOCUMENTS

| | | | |
|---|---|---|---|
| 7,193,323 B2 | 3/2007 | Cabral, Jr. et al. | |
| 7,217,655 B2 | 5/2007 | Cabral, Jr. et al. | |
| 8,294,132 B2 * | 10/2012 | Miao et al. | 257/3 |
| 8,344,358 B2 * | 1/2013 | Avouris et al. | 257/24 |
| 2007/0020918 A1 * | 1/2007 | Hirokawa et al. | 438/626 |
| 2011/0059599 A1 * | 3/2011 | Ward et al. | 438/507 |

OTHER PUBLICATIONS

2007 MXP Project, "Graphene," University of Minnesota School of Physics and Astronomy, 2007, Retrieved from http://mxp.physics.umn.edu/s07/Projects/S07_Graphene/intro.htm, Dec. 2, 2010, 14 pgs.
A. Ismach, "Direct Chemical Vapor Deposition of Graphene on Dielectric Surfaces," ACS Publications, Apr. 2, 2010, 15 pgs.
Class for Physis of the Royal Swedish Academy of Sciences, "Graphene, Scientific Background on the Nobel Prize in Physics 2010," Kungl Vetenskaps-Akademien, Oct. 5, 2010, 13pgs.
Kondo, et al., "Low-Temperature Synthesis of Graphene and Fabrication of Top-Gated Field Effect Transistors without Using Transfer Processes", Published Feb. 12, 2010, Applied Physics Express, vol. 3, Issue 2, pp. 025102-025102-3 (2010), Abstract Retrieved from http://apex.jsap.jp/link?APEX/3/025102/ on Dec. 3, 2010, 2 pgs.

(Continued)

*Primary Examiner* — James Mitchell
(74) *Attorney, Agent, or Firm* — Gardere Wynne Sewell LLP

(57) ABSTRACT

A copper interconnect structure has an intrinsic graphene cap for improving back end of line (BEOL) reliability of the interconnect by reducing time-dependent dielectric breakdown (TDDB) failure and providing resistance to electromigration. Carbon atoms are selectively deposited onto a copper layer of the interconnect structure by a deposition process to form a graphene cap. The graphene cap increases the activation energy of the copper, thus allowing for higher current density and improved resistance to electromigration of the copper. By depositing the graphene cap on the copper, the dielectric regions remain free of conductors and, thus, current leakage within the interlayer dielectric regions is reduced, thereby reducing TDDB failure and increasing the lifespan of the interconnect structure. The reduction of TDDB failure and improved resistance to electromigration improves BEOL reliability of the copper interconnect structure.

25 Claims, 3 Drawing Sheets

OTHER PUBLICATIONS

Libo Gao, et al., "Efficient Growth of High-Quality Graphene Films on Cu Foils by Ambient Pressure Chemical Vapor Deposition," Published Nov. 4, 2010, Applied Physics Letters, vol. 97, Issue 18, Abstract Retrieved from http://apl.aip.org/resource/1/applab/v97/i18/p183109_s1?isAuthorized=no on Dec. 3, 2010, 2pgs.

Obraztsov, et al., "Chemical Vapor Deposition of Thin Graphite Films of Nanometer Thickness," Carbon, vol. 45, Issue 10, Sep. 2007, 5 pgs.

Sidorov, et al., "Electrostatic Deposition of Graphene," 2007, Nanotechnology 18 135301, 4 pgs.

"Sugar and Slice Make Graphene Real Nice," ECN Electronic Component News, Nov. 1, 2010, Retrieved from http://www.ecnmag.com/News/2010/11/Sugar-and-slice-make-graphene-real-nice/ on Dec. 3, 2010, 3 pgs.

Tung, et al., "Low-Temperature Solution Processing of Graphene#Carbon Nanotube Hybrid Materials for High-Performance Transparent Conductors," ACS Publications, Nano Letters 2009, vol. 9, No. 5, 1949-1955, Publication Date Apr. 10, 2009, Downloaded from http://pubs.acs.org on May 13, 2009, 8 pgs.

Xiaogan Liang, "Orderly Deposition of Uncontaminated Graphene, IB-2672," U.S. Dept. of Energy, Berkeley Lab, Aug. 26, 2010, Retrieved from http://www.lbl.gov/tech-transfer/techs/lbn12672.html, Dec. 2, 2010, 2 pgs.

Xuesong Li, et al., "Large-Area Synthesis of High-Quality and Uniform Graphene Films on Cooper Foils," Science AAAS, Science 324, 1312 (2009), Jun. 5, 2009, Downloaded from www.sciencemag.org on Apr. 13, 2010, 4 pgs.

* cited by examiner

COPPER INTERCONNECT STRUCTURE HAVING A GRAPHENE CAP

BACKGROUND

Technical Field

The present invention relates generally to back end of line (BEOL) wiring interconnect structures of integrated circuit chips and, more specifically, to a BEOL copper wiring interconnect structure having a graphene cap deposited to improve BEOL reliability of the interconnect by reducing time-dependent dielectric breakdown (TDDB) failure and providing resistance to electromigration.

INTRODUCTION

Present demands of the microelectronics industry for increased speed and efficiency yield integrated circuits with increased density and performance characteristics. In keeping with this trend, typical interconnect structures are fabricated using a greater purity of copper due to its high-performance capacity. However, as these copper interconnect structures are scaled down, current density in the copper interconnects increases exponentially, resulting in current-driven electromigration of the copper atoms, thereby leading to several defects in the interconnect structure such as, for example, voids and hillock failures. Current industry practices attempt to reduce electromigration of copper interconnects through the use of a CoWP alloy metal cap deposited on the top surface of the copper through electroless deposition. Although in some applications a CoWP alloy metal cap has shown the ability to slow electromigration, other issues arise through its use. For example, the deposition of the CoWP alloy metal cap often results in unwanted nucleation or deposition of the CoWP alloy in interlayer dielectric regions. Due to the electrical conductivity of CoWP, this results in high leakage of current through the dielectric layer and increased TDDB failure, thus shortening the lifespan of the dielectric and damaging the integrated circuit. The inadequacies of CoWP alloy metal caps present BEOL reliability issues for copper interconnect structures. As such, there exists a need for an interconnect structure that offers improved BEOL reliability by reducing TDDB failure and providing resistance to electromigration.

SUMMARY

Failure of a wire (e.g., a copper interconnect) can be directly attributed to the effects of electromigration (e.g., voids and hillocks) typically occurring at the grain boundaries of the wire, wherein the degree of electromigration within the wire may be reflected by the time to failure of the wire. Simply put, as electromigration increases, the time to failure of the wire decreases. In general, the degree of electromigration is dependent upon several physical variables such as, for example, cross-sectional area of the wire and temperature. However, electromigration can be more directly attributed to the density of the current traveling through the wire (i.e., current density) and the energy (i.e., activation energy) required to initiate a momentum transfer between conducting electrons and diffusing metal atoms in the wire. The relationship of these variables is represented by Black's equation, provided below, wherein the mean time to failure (MTTF) of a wire is generally represented as:

$$MTTF = A(j^{-n})\exp(Ea/kT),$$

wherein A is a constant based on the cross-sectional area of the wire, j is the current density, Ea is the activation energy, k is Boltzmann's constant, T is the temperature, and n is a scaling factor. Assuming a constant activation energy (Ea) for an interconnect structure, as current density (j) increases, resistance to electromigration decreases. Therefore, according to Black's equation, increasing the activation energy allows for a higher tolerance for current density, and thus, a greater resistance to electromigration. If the activation energy is great enough, electromigration within the interconnect can be significantly reduced—if not eliminated. In essence, Black's equation can be used to compare the resistance to electromigration for different conductors by determining the MTTF of the conductors for a given current density. When comparing the MTTF of the conductors for a given current density, those with a greater MTTF are presumed to have greater resistance to electromigration, whereas those with a lower MTTF are presumed to have less resistance to electromigration.

The present disclosure provides a copper interconnect structure having one or more intrinsic graphene caps for improving BEOL reliability of interconnect structures in integrated circuits. Carbon atoms are selectively deposited onto a copper layer of the interconnect structure by a deposition process to form a graphene cap. The graphene cap increases the activation energy of the copper, thus allowing for higher current density and increased resistance to electromigration of the copper. By depositing the graphene cap on the copper, the dielectric regions remain free of conductors and, thus, current leakage within the interlayer dielectric regions is reduced, thereby reducing TDDB failure and increasing the lifespan of the interconnect structure. The reduction of TDDB failure and improved resistance to electromigration improve BEOL reliability of the copper interconnect structure.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF THE DRAWINGS

Embodiments are illustrated by way of example in the accompanying figures exaggerated to show detail supporting the text of the disclosure, in which like reference numbers indicate similar parts, and in which.

DETAILED DESCRIPTION OF THE DRAWINGS

The present disclosure provides a copper interconnect structure having an intrinsic graphene cap for improving BEOL reliability of interconnect structures in integrated circuits. The placement of the graphene cap on the copper layers improves BEOL reliability of the interconnect structure in two ways: (i) by improving the resistance to electromigration of the copper interconnect, and (ii) by reducing TDDB failure of the interconnect structure. As explained in greater detail below, the graphene cap increases the activation energy of the copper, thus allowing for higher current density and thereby increasing resistance to electromigration of the copper. The placement of the graphene cap on the copper layer inhibits current leakage within the interlayer dielectric regions, thereby reducing TDDB failure and increasing the lifespan of the interconnect structure. Since the graphene cap is formed through the selective deposition of carbon atoms on the copper, even if some of the carbon atoms were to be deposited on the dielectric region, the carbon atoms act as an insulator and, thus, would inhibit current leakage within the dielectric region. As previously stated, the benefits provided by the graphene cap, namely, the reduction of TDDB failure and improved resistance to electromigration, improve BEOL reliability of the copper interconnect structure.

Figure 1A:
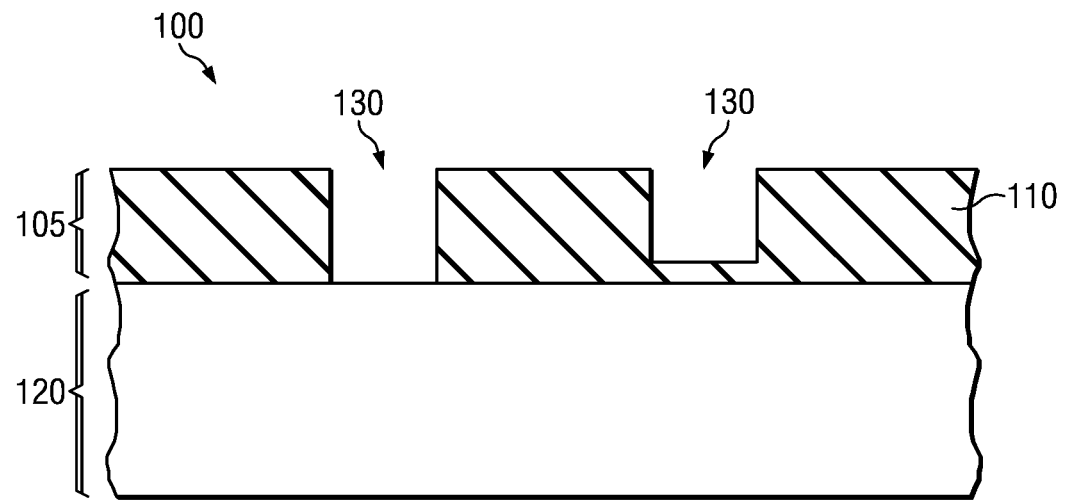
FIGS. 1A and 1B illustrate a cross-sectional view of an example known interconnect structure.
Figure 1B:
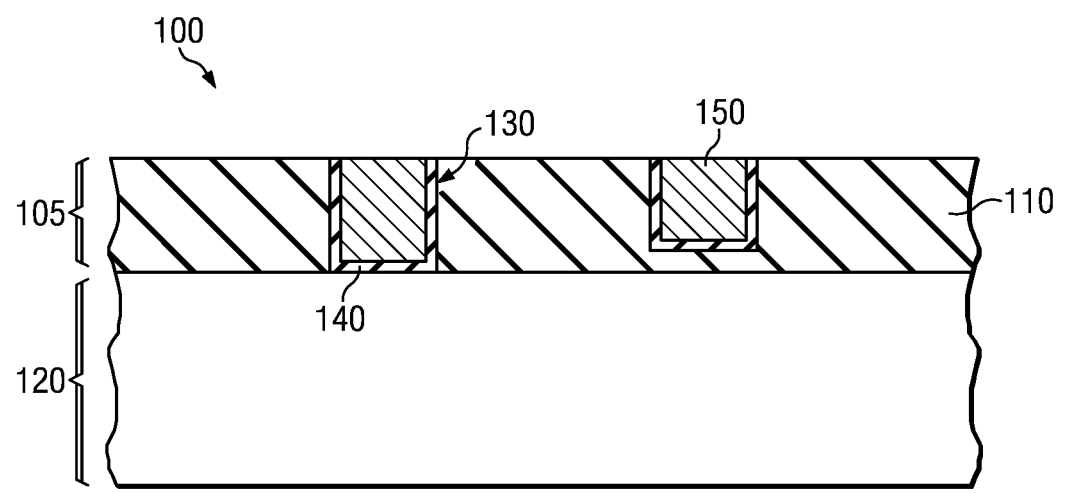

FIG. 1A provides a cross-sectional view of an example of a known interconnect structure 100 having a metallization layer 105 formed on a substrate layer 120. Since the present disclosure is directed to BEOL semiconductor manufacturing applications, the substrate layer 120 is illustrated as a generic layer. However, the substrate 120 is presumed to include a semiconductor wafer as well as circuitry manufactured during front end of line (FEOL) processes such as, for example, sources, gates, drains, interconnects, contacts, resistors, and other circuitry that may be manufactured during FEOL processes. The metallization layer 105 includes a dielectric layer 110 having trenches or vias 130 formed therein through etching, or other methods well-known in the art. The dielectric layer 110 can be any suitable dielectric material used in the semiconductor manufacturing industry such as, for example, an oxide (e.g., silicon dioxide, nitride, silicon nitride, etc.), a ULK film, or a spin-on silicon-based dielectric. The dielectric layer 110 may be formed by any of various well-known methods, including chemical vapor deposition and spin-on techniques. As shown in FIGS. 1A and 1B, the trenches 130 may be of varying depth extending into the dielectric layer 110 and, in some cases, to the top surface of the substrate layer 120.

As illustrated in FIG. 1B, the metallization layer 105 further comprises barrier layers 140 and copper layers 150. The barrier layers 140 are deposited as liners along the inside walls of the trenches 130, and the copper layers 150 are deposited in the trenches 130 on the outer surfaces of the barrier layers 140. The barrier layers 140 may be comprised of one or more layers of various metals and metal alloys known in the art such as, for example, tantalum, tungsten, tantalum nitride, titanium nitride, palladium, ruthenium, rhodium, osmium, or rhenium. The barrier layer 140 may act as a diffusion layer, and/or as an adhesion layer, between the dielectric layer 110 and the copper layer 150. It should be understood that the elements described above and illustrated in FIGS. 1A and 1B are not limited to the above description, and may be implemented in any way known by those skilled in the art without departing from the scope of the present disclosure. It should also be appreciated by those skilled in the art that the metallization layer 105 is applied to the substrate layer 120 during BEOL manufacturing, and that the copper interconnect structure 100 illustrated in FIGS. 1A and 1B may include one or more metallization layers 105 stacked on top of each other without departing from the spirit and scope of the present disclosure.

Figure 2A:
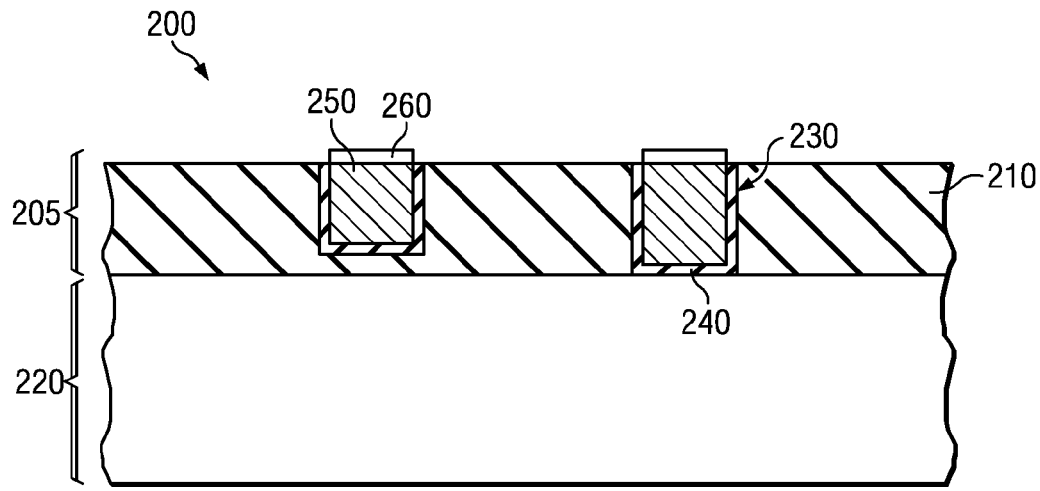
FIGS. 2A, 2B, and 2C illustrate cross-sectional views of multiple example embodiments of an interconnect structure in accordance with the present disclosure.
Figure 2B:
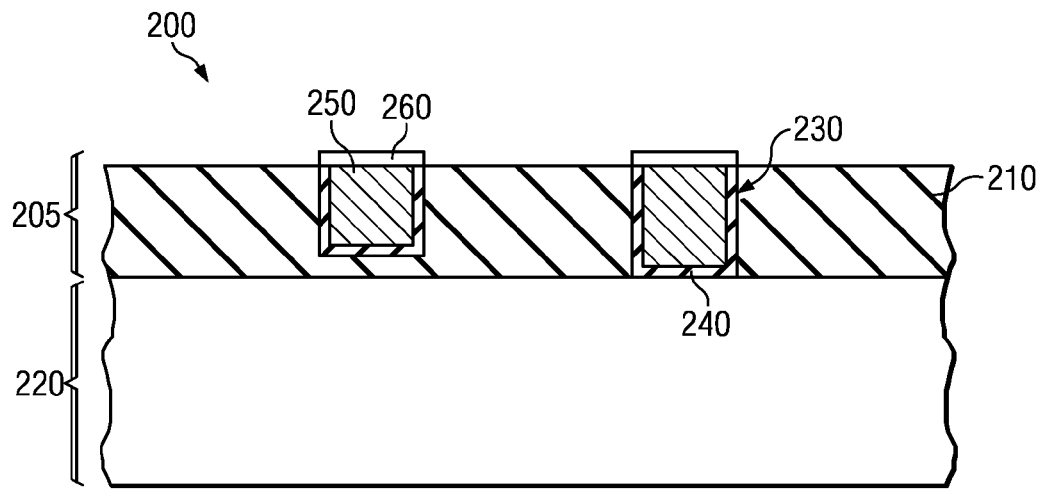
Figure 2C:
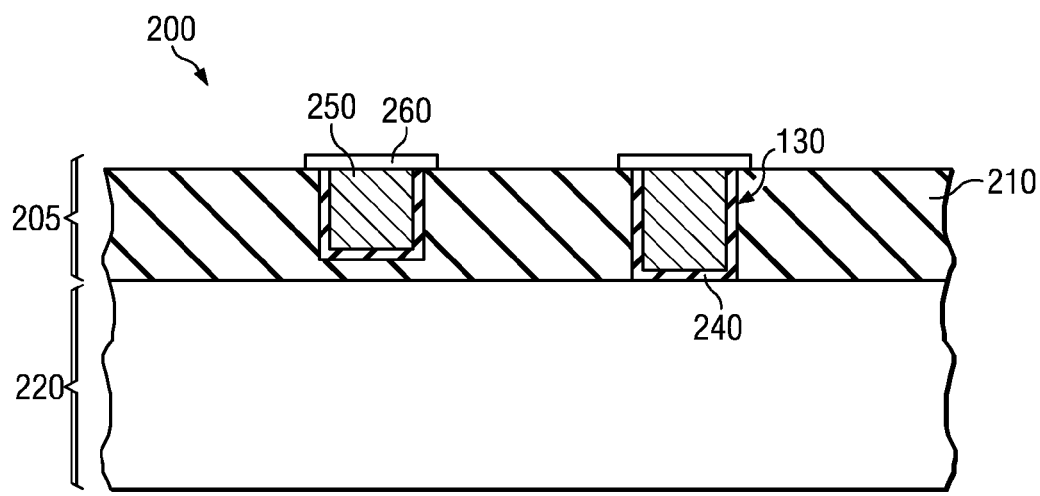

FIGS. 2A, 2B, and 2C illustrate multiple embodiments of an interconnect structure 200 in accordance with the present disclosure, wherein the interconnect structure 200 comprises a metallization layer 205 disposed on the top surface of a substrate layer 220. As described above, the substrate layer 220 is illustrated as a generic layer presumed to include a semiconductor wafer as well as circuitry manufactured during FEOL processes. The metallization layer 205 comprises a dielectric layer 210, barrier layers 240, copper layers 250 and intrinsic graphene caps 260. The metallization layer 205 also includes trenches 230 formed in the dielectric layer 210, wherein barrier layers 240 and copper layers 250 are deposited within the trenches 230 as explained above with respect to FIGS. 1A and 1B. The intrinsic graphene caps 260 have a thickness of one atom, and may be formed by selectively depositing carbon atoms on the copper layers 250 during BEOL manufacturing by means known in the art such as, for example, chemical vapor deposition or atomic layer deposition processes. For example, in one embodiment, graphene caps 260 may be formed (i.e., deposited) on the interconnect structure 200 by a chemical vapor deposition process using a mixture of methane and hydrogen. Since the deposition process occurs during BEOL manufacturing, some deposition processes may include a low-temperature chemical vapor deposition or atomic layer deposition process designed to protect the integrated circuit from extreme temperatures. In some cases, a higher-temperature deposition process may be implemented when the integrated circuit is comprised of a more heat-tolerant material such as, for example, silicon carbide. It should be appreciated by those skilled in the art that the metallization layer 205 is applied to the substrate layer 220 during BEOL manufacturing, and that the copper interconnect structure 200 illustrated in FIGS. 2A, 2B, and 2C may include one or more metallization layers 205 stacked on top of each other without departing from the spirit and scope of the present disclosure.

In the example embodiment illustrated in FIG. 2A, the graphene caps 260 are deposited only on the top surface of copper layers 250. In other embodiments, such as that illustrated in FIG. 2B, the graphene caps 260 are deposited on the top surface of the copper layers 250 and the barrier layers 240. FIG. 2C illustrates an additional embodiment, wherein the graphene caps 260 are deposited on the top surface of the metallization layer 205 such that the graphene caps 260 cover the copper layers 250, barrier layers 240, and a portion of the dielectric layer 210. The embodiment illustrated in FIG. 2C, provides an example embodiment wherein the graphene cap 260 deposited on the copper layer 250 is grown such that graphene cap 260 extends over the dielectric layer 210 without creating an electrical connection between any two graphene caps 260. It should be appreciated that as long as the copper layers 250 are capped by the intrinsic graphene 260, various combinations of the disclosed embodiments may be made without departing from the scope of the invention as set forth in the appended claims. For example, in some embodiments, some graphene caps 260 may cover only copper layers 250, while other graphene caps 260 cover copper layers 250 and barrier layers 240, and other graphene caps 260 cover copper layers 250, barrier layers 240, and a portion of the dielectric layer 210. Additionally, the interconnect structure 200 may comprise additional elements not illustrated in FIG. 2A, 2B, or 2C, such as, for example, a silicon carbonitride barrier or Nblock film deposited on the top surface of the metallization layer 205.

Figure 3:
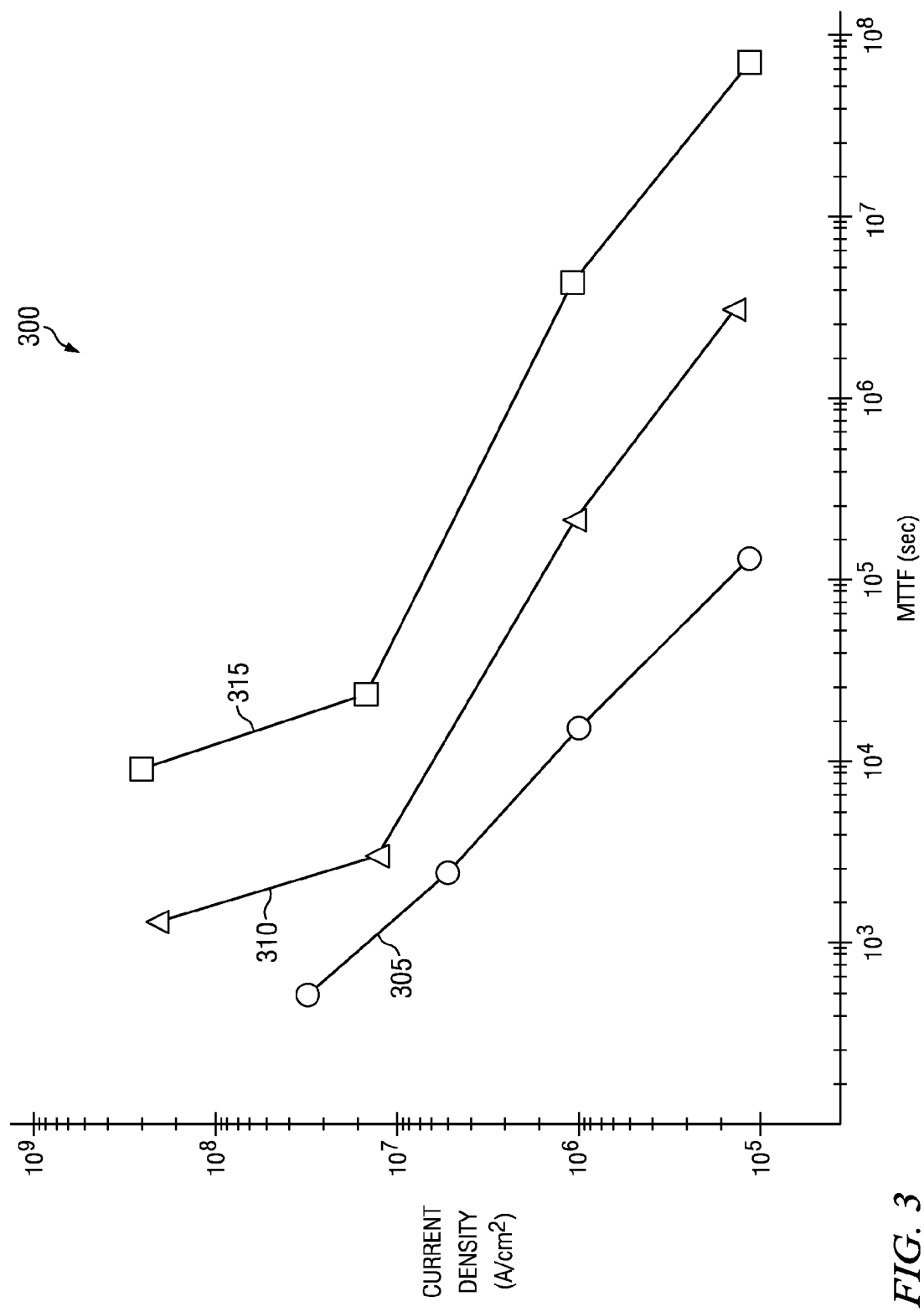
FIG. 3 illustrates a graph representing the MTTF of a group of interconnects for a given current density in accordance with Black's equation.

FIG. 3 illustrates a graph 300 representing the MTTF with respect to a given current density at 200° C. for a group of copper interconnects having a cross-sectional width of 0.7 um, in accordance with Black's equation. Line 305 represents a copper interconnect having no cap, line 310 represents a conventional copper interconnect having a CoWP metal alloy cap, and line 315 represents a copper interconnect having a graphene cap in accordance with the present disclosure. For purposes of calculating the MTTF in accordance with Black's equation, the interconnects represented in the graph 300 all have identical cross-sectional areas (A), temperatures (T), and scaling factors (n). Therefore, the distinguishing variable between each of the represented interconnects is the activation energy (Ea) of each interconnect, which is dependent upon the material (i.e., CoWP, graphene, etc.) present at the grain lattice of the copper layer of the interconnect. For example, the activation energy for grain boundary diffusion of a copper wire having no cap may be approximately 0.9-1.0 eV, the activation energy for grain boundary diffusion of a copper wire capped with a CoWP metal alloy may be approximately 2.0-2.6 eV, and the activation energy for grain boundary diffusion of a copper wire having an intrinsic graphene cap may be approximately 2.3-2.5 eV. As previously discussed, resistance to electromigration of each interconnect is indicated by the MTTF of the interconnect for a given current density (j), wherein a lower MTTF indicates less resistance to electromigration, and a greater MTTF indicates increased resistance to electromigration. It should be understood that the graph 300 presented in FIG. 3 is provided to illustrate example MTTF for various example copper interconnect structures in accordance with Black's equation, and may not be properly drawn to scale or include data obtained from actual experimentations.

One of the benefits provided by the embodiments described above and illustrated in FIGS. 2A, 2B, and 2C is that the deposition of the graphene caps 260 on the copper layers 250 increases the activation energy at the grain lattice of the copper layers 250. The increase in activation energy increases the tolerance for current density within the grain lattice of the copper layer of the interconnect. In accordance with Black's equation, and as illustrated by line 315 in FIG. 3, the increase in activation energy results in increased MTTF of the copper layers, thereby indicating a greater resistance to electromigration. When compared to the other interconnect structures 305 and 310 represented in FIG. 3, the interconnect structure having graphene caps has increased resistance to electromigration due to an increase in the activation energy of the copper layers of the interconnect.

It should be understood that although graphene may, in some embodiments, provide an activation energy similar to that of CoWP, an advantage to using graphene instead of CoWP for capping the copper line is that the elements comprising the graphene cap (i.e., carbon), during (and even after) the deposition process, do not diffuse to the dielectric regions. As such, the graphene cap is not subject to current leakage within the dielectric regions. Furthermore, to the extent carbon atoms are deposited on the dielectric region when forming the graphene cap, the carbon atoms function as an insulator and, thus, do not contribute to leakage current within the dielectric region. Conversely, the cobalt and tungsten elements of a CoWP cap tend to diffuse to the dielectric regions and can support current leakage which results in increased TDDB failure. The use of the graphene cap deposited on a copper layer will produce a decrease in TDDB failure, thereby improving BEOL reliability and increasing the lifespan of the interconnect structure.

As provided by the foregoing disclosure, deposition of an intrinsic graphene cap onto a copper layer in an interconnect structure increases the activation energy of the copper layer and inhibits current leakage within the dielectric regions. The increased activation energy improves resistance to electromigration of the copper interconnect structure, and the inhibited current leakage reduces TDDB failure. As such, when compared to conventional copper interconnect structures, the use of graphene caps presents an attractive solution for improving BEOL reliability of copper interconnect structures in integrated circuits by reducing TDDB failure and improving resistance to electromigration.

What is claimed is:

1. An apparatus comprising:
   a substrate layer; and
   a back end of line metallization interconnect layer absent any active device disposed over said substrate layer including integrated circuit devices, said back end of line metallization interconnect layer comprising:
     a dielectric layer;
     a trench formed within said dielectric layer;
     a barrier layer disposed within said trench;
     a conducting interconnect disposed upon said barrier layer and filling said trench; and
     a layer of intrinsic graphene deposited at least on an upper surface of said conducting interconnect.

2. The apparatus as set forth in claim 1, wherein said graphene layer is deposited via a chemical vapor deposition process.

3. The apparatus as set forth in claim 1, wherein said graphene layer is deposited via an atomic layer deposition process.

4. The apparatus as set forth in claim 1, wherein said graphene layer is further deposited on at least a portion of said barrier layer.

5. The apparatus as set forth in claim 1, wherein said graphene layer is further deposited over at least a portion of said dielectric layer.

6. The apparatus as set forth in claim 1, wherein said graphene layer is operable to inhibit current leakage within said dielectric layer.

7. The apparatus as set forth in claim 1, wherein said graphene layer is operable to increase a threshold of energy required to initiate a momentum transfer between conducting electrons and diffusing metal atoms in said conducting interconnect.

8. The apparatus as set forth in claim 1, wherein said conducting interconnect comprises a metal containing copper.

9. The apparatus as set forth in claim 1, wherein said barrier layer disposed within said trench is further disposed on at least a portion of said substrate layer.

10. The apparatus as set forth in claim 1, wherein said substrate layer is formed during front end of line semiconductor manufacturing.

11. The apparatus as set forth in claim 1, further comprising one or more additional back end of line metallization interconnect layers stacked on top of said back end of line metallization interconnect layer disposed on said substrate layer.

12. A method, comprising:
   depositing, during back end of line semiconductor manufacturing, a layer of intrinsic graphene on a top surface of a copper layer, said copper layer disposed within a trench formed in a dielectric layer of an interconnect structure, wherein the layer of intrinsic graphene is operable to inhibit current leakage within the dielectric layer.

13. The method as set forth in claim 12, wherein said deposited intrinsic graphene layer functions to increase a threshold of energy required to initiate a momentum transfer between conducting electrons and diffusing metal atoms in said copper layer.

14. The method as set forth in claim 12, wherein depositing comprises depositing said layer of intrinsic graphene via a chemical vapor deposition process.

15. The method as set forth in claim 12, wherein depositing comprises depositing said layer of intrinsic graphene via an atomic layer deposition process.

16. The method as set forth in claim 12, further comprising depositing said layer of intrinsic graphene over at least a portion of said dielectric layer.

17. The method as set forth in claim 12, further comprising depositing said layer of intrinsic graphene on at least a portion of a barrier layer disposed within said trench.

18. An apparatus comprising:
 a substrate layer; and
 a metallization layer disposed over the substrate layer, the metallization layer comprising:
  a dielectric layer,
  a trench formed within the dielectric layer, the trench having a lateral width extending between a first wall and a second wall,
  a barrier layer disposed within the trench,
  a conducting interconnect disposed upon the barrier layer and within the trench, and
  a layer of intrinsic graphene deposited on an upper surface of the conducting interconnect, the layer of intrinsic graphene having a lateral width less than or equal to the lateral width of the trench.

19. The apparatus as set forth in claim 18, wherein the graphene layer is operable to inhibit current leakage within the dielectric layer.

20. The apparatus as set forth in claim 18, wherein the graphene layer is operable to increase a threshold of energy required to initiate a momentum transfer between conducting electrons and diffusing metal atoms in the conducting interconnect.

21. The apparatus as set forth in claim 18, wherein the substrate layer is formed during front end of line semiconductor manufacturing, and the metallization layer is formed during back end of line semiconductor manufacturing.

22. An apparatus comprising:
 a substrate layer; and
 a metallization layer disposed over the substrate layer, the metallization layer comprising:
  a dielectric layer,
  a trench formed within the dielectric layer,
  a barrier layer disposed within the trench, the barrier layer having a first wall and a second wall,
  a conducting interconnect disposed within the trench and having a lateral width extending between the first wall of the barrier layer and the second wall of the barrier layer, and
  a layer of intrinsic graphene deposited on an upper surface of the conducting interconnect, the layer of intrinsic graphene having a lateral width substantially equal to the lateral width of the conducting interconnect.

23. The apparatus as set forth in claim 22, wherein the graphene layer is operable to inhibit current leakage within the dielectric layer.

24. The apparatus as set forth in claim 22, wherein the graphene layer is operable to increase a threshold of energy required to initiate a momentum transfer between conducting electrons and diffusing metal atoms in the conducting interconnect.

25. The apparatus as set forth in claim 22, wherein the substrate layer is formed during front end of line semiconductor manufacturing, and the metallization layer is formed during back end of line semiconductor manufacturing.

* * * * *